United States Patent [19]

Koh

[11] Patent Number: 5,554,557
[45] Date of Patent: Sep. 10, 1996

[54] METHOD FOR FABRICATING A STACKED CAPACITOR WITH A SELF ALIGNED NODE CONTACT IN A MEMORY CELL

[75] Inventor: Chao-Ming Koh, Hsinchu, Taiwan

[73] Assignee: Vanguard International Semiconductor Corp., Hsin-Chu, Taiwan

[21] Appl. No.: 597,529

[22] Filed: Feb. 2, 1996

[51] Int. Cl.$^6$ ............................. H01L 21/70; H01L 27/00
[52] U.S. Cl. ......................... 437/52; 437/60; 437/919
[58] Field of Search ........................... 437/47–48, 52, 437/60, 919; 148/DIG. 14; 257/306–310

[56] References Cited

U.S. PATENT DOCUMENTS

| | | | |
|---|---|---|---|
| 5,164,881 | 11/1992 | Ahn | 437/52 |
| 5,185,282 | 2/1993 | Lee et al. | 437/52 |
| 5,234,855 | 8/1993 | Rhodes et al. | 437/47 |
| 5,380,673 | 1/1995 | Yang et al. | 437/47 |
| 5,409,855 | 4/1995 | Jun | 437/52 |
| 5,444,010 | 8/1995 | Park et al. | 437/60 |

*Primary Examiner*—H. Jey Tsai
*Attorney, Agent, or Firm*—George O. Saile; William J. Stoffel

[57] ABSTRACT

The present invention provides a method of manufacturing a fence shaped capacitor for a DRAM which begins by providing a substrate including a field effect transistor having a transfer gate with nitride sidewall spacers. Next, a first insulation layer, a first polysilicon layer and a second insulation layer are formed over the transistor. A patterning step is used to define first openings in the second insulation layer over the source of the transistor. First polysilicon sidewall spacers (e.g., fences) are formed on the sidewalls of the first opening thus defining a second opening. Using the first spacers and the spacers on the transfer gates, the first insulation layer is etched to expose the source and thereby forming a node contact opening. A bottom storage electrode is formed covering the first spacers (e.g., fences) and the sidewall of the node contact opening. A dielectric layer and top plate electrode are formed over the bottom storage electrode. The method reduces process complexity by using only one photo operation to form the node contact opening and increases process tolerances by making the node contact self-aligning using the first sidewall spacers and the nitride sidewall spacers.

25 Claims, 7 Drawing Sheets

METHOD FOR FABRICATING A STACKED CAPACITOR WITH A SELF ALIGNED NODE CONTACT IN A MEMORY CELL

BACKGROUND OF THE INVENTION

1) Field of the Invention

This invention relates generally to fabrication of capacitors in DRAM cells and more particularly to a method for fabricating fence shaped-capacitors with self aligned storage nodes.

2) Description of the Prior Art

Very large scale integration (VLSI) semiconductor technologies have dramatically increased the circuit density on a chip. The miniaturized devices built in and on semiconductor substrate, making up these circuits, are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field-effect-transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Workers in the art are aware of the challenges to produce small high capacitance DRAM capacitors. For example U.S. Pat. No. 5,380,673, Yang et al., shows a method for forming a stacked capacitor which has an additional electrically conducting layer in the polysilicon layer of the bottom electrode. Also, U.S. Pat. No. 5,234,855, Rhodes et al., discloses a method to form stacked comb spacer capacitor (SCSC) having a spiked v-shaped (or comb-shaped) cross-section. The spiked polysilicon structure increases the capacitance by 50%. Others have increased the cell capacitance by forming recesses under the bottom storage electrode thereby increasing the bottom electrode surface area. See U.S. Pat. No. 5,444,010, Park et al.

However, many of the prior art methods require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and that further increase the cell capacitance.

There is a challenge to develop methods of manufacturing these capacitors that minimize the manufacturing costs and maximize the device yields. In particular, there is a challenge to develop a method which minimizes the number of photoresist masking operations and provides maximum process tolerance to maximize product yields. More particularly, a self-aligned contact node structure is required to increase process tolerances and yields. There is also a challenge to develop a capacitor which is not limited in size by size the photolithographic techniques.

SUMMARY OF THE INVENTION

It is an object of the present invention to provide a method for fabricating a capacitor which can overcome the size limitations of photographic techniques and has a high capacitance.

It is an object of the present invention to provide a method for fabricating a capacitor having fence shaped storage node with a high density and capacitance.

It is an object of the present invention to provide a method for fabricating a DRAM having a capacitor with a self aligned node contact which uses only one photo step to form the node contact and storage electrode.

It is an object of the present invention to provide a method for fabricating a DRAM having a fence shaped capacitor with a self aligned node contact which increases the photo process tolerances to form the node contact.

To accomplish the above objectives, the present invention provides a method of manufacturing a DRAM with a capacitor having a fence shaped storage electrode. The capacitor has a self aligned contact structure using two sets of spacers: lower spacers on the transfer gates (of a MOS transistor and a wordline) and upper spacers on sidewalls of an upper insulation layer. The process begins by providing a bit line and an associated field effect transistor having lower spacers on the transfer gate. Next, a first insulation layer and a first conductive layer are formed over the transistor and bitline. In the one photo step for the contact opening, a first masking layer is photo-patterned to define first openings in the first insulation layer over the node contacts (i.e., sources). Upper spacers (i.e., first polysilicon spacers) are formed on the sidewalls the first opening of the first insulation layer thus defining a contact opening. Using the upper and lower spacers are masks, the first insulation layer is etched thereby exposing the source and completing the formation of the node contact opening. The first insulation layer is then removed. A bottom storage electrode is formed over the first sidewall spacers, the first insulation layer on the sidewalls of the node contact opening, and the source. The bottom storage electrode is preferably has a top surface formed of a rugged polysilicon which increases surface area and capacitance. A dielectric layer and top plate electrode are formed over the bottom storage electrode. The invention provides a self aligning method to define a node contact using only one photoresist step which reduces costs and increases process tolerances.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a DRAM having a fence shaped capacitor which has small dimension, high capacitance and is simple to manufacture. The present invention provides a method of manufacturing a capacitor for a memory which has a self aligned contact structure using two sets of spacers: lower spacers 20 on the transfer gates 14 16 18 and upper spacers 38 on sidewalls of an upper insulation layer 34. See FIG. 7. The process for forming the field oxide (FOX) and the field effect transistor structure as presently practiced in manufacturing DRAM cells are only briefly described in order to better understand the current invention. It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only several DRAM storage cells out of a multitude of cells that are fabricated simultaneously on the substrate. Also, the capacitor's use is not limited to DRAM devices and can be used in other device types, such as SRAM, and logic chips.

Figure 1:
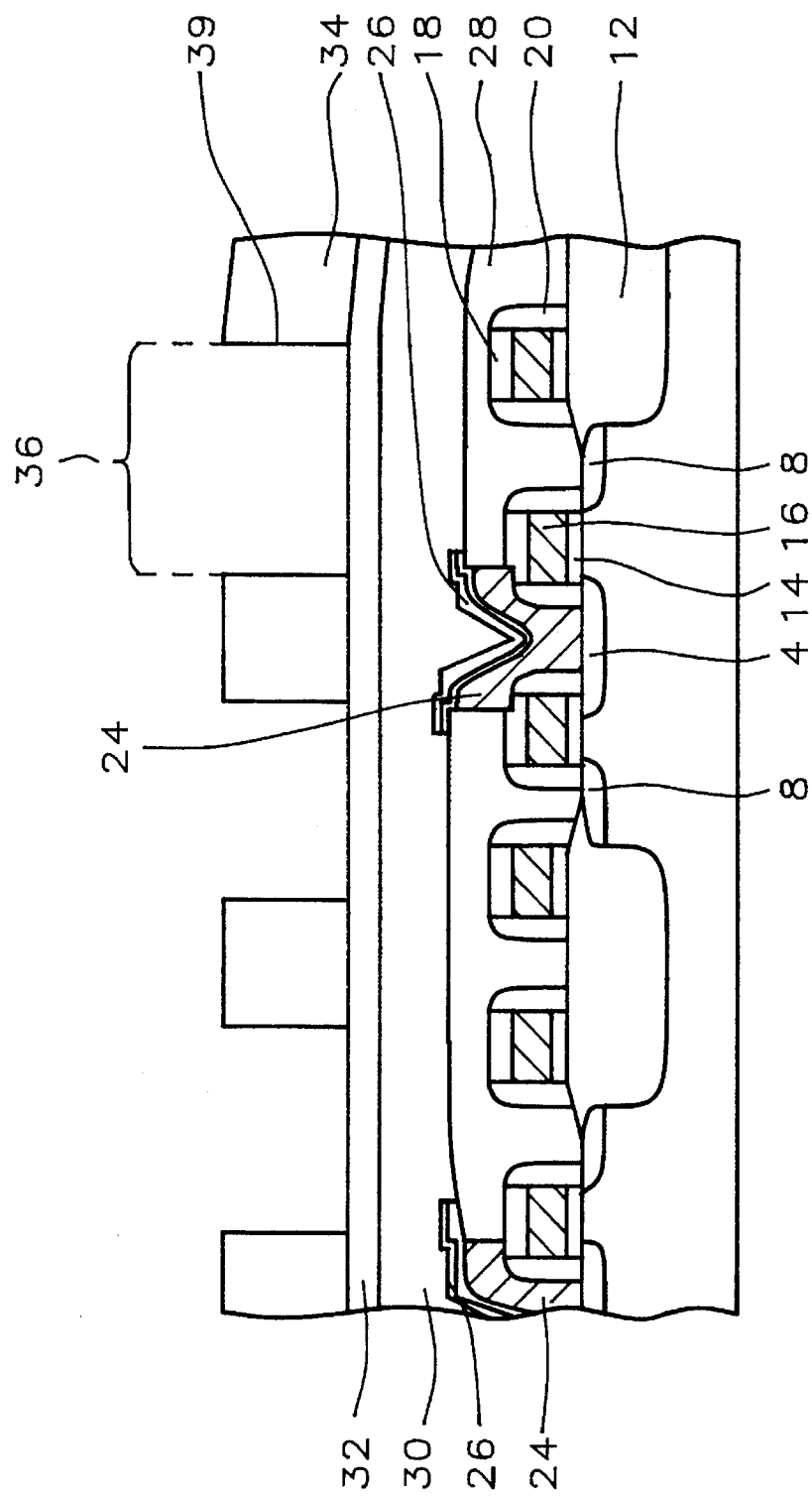
FIGS. 1 through 7 are cross sectional views taken across parallel word lines for illustrating the method for manufacturing a DRAM having a fence shaped capacitor according to the present invention.

As shown in FIG. 1, the method for fabricating a fence shaped capacitor begins by providing a substrate having a field oxide layer 12 and FET devices formed thereon. Field oxide layer 12 is formed on a semiconductor substrate 10 for defining active device regions and isolation regions. The preferred substrate is composed of a P-type single crystal silicon having a (100) crystallographic orientation. A relatively thick field oxide (FOX) 12 is formed around the active device areas to electrically isolate these areas. This field oxide can be formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness is in the range of about 3000 to 6000 Å.

The semiconductor FET device is then formed in the active device area after removing the a silicon nitride barrier layer and the pad oxide in a convention wet etch. The most commonly used device for dynamic random access memory (DRAM) is MOSFET. This device is formed by first thermally oxidizing the active device area to form a thin gate oxide. The preferred thickness is from about 65 to 150 Å.

An appropriately doped polysilicon layer, and an insulating layer are deposited over the gate oxide layer and conventional photolithographic techniques are used to pattern them into a transfer gate comprising a gate oxide 14, a gate electrode 16, and the gate insulating layer 18. As shown in FIG. 1, transfer gates 14 16 18 are formed over the field oxide layer 12 and on the substrate disposed between a source (node contact) 8 and a drain 4. Often, the gate electrodes formed over the field oxide form the word lines that electrically connect to the appropriate peripheral circuits on the DRAM chip. The lightly doped source/drain(shown with the source/drain 8 4) of the N-channel MOSFET is formed next, usually by implanting an N-type atomic species such as arsenic or phosphorus through the spaces between the gate electrodes 14 16 18. For example, a typical implant might consist of phosphorus P31 at a dose of between about 1 to 10E13 atoms/cm$^2$ and at an energy between about 30 to 80 Kev.

After forming the lightly doped source/drain, sidewall spacers 20 are formed on the gate electrode 14 16 18 sidewalls. The sidewall spacers facing the source 8 are called inside sidewall spacers. The transfer gate sidewall spacers are preferably formed of silicon oxide or silicon nitride and are preferably formed of silicon nitride. The spacers 20 can have a thickness in the range of between about 400 to 1500 Å and more preferably about 800 Å. The spacers have a height in the range of between about 3000 to 8000 Å and more preferably about 4000 Å. The distance between the inside walls of the spacers is preferably in the range of between about 500 and 2000 Å and more preferably about 1000 Å.

These sidewall spacers 20 are formed by depositing a low temperature silicon oxide and anisotropically etching back to the silicon surface. For example, the silicon oxide could be formed using a chemical vapor deposition using tetraethoxysilane (TEOS) at a temperature in the range of about 650° to 900° C. and the etch back performed in a low pressure reactive ion etcher.

The source/drain regions 8 4 of the MOSFET are now implanted between the spacers 20 with a N type atomic species, for example, arsenic (As75), to complete the source/drain 8 4. The implantation is usually done through a thin layer of silicon oxide of about 200 to 300 Å in thickness to minimize implant channeling and to protect against contamination by metals and other impurities. A typical implantation dose is between 2E15 to 1E16 atoms/cm$^2$ and an energy of between about 20 to 70 Kev.

As shown in FIG. 1, a dielectric insulating layer 28 is formed over the substrate surface and contacts the source and drain areas. The conformal insulating layer 28 is preferably composed of silicon oxide formed by a low temperature chemical vapor deposition process using tetraethylorthosilicate (TEOS). Layer 28 preferably has a thickness in the range between about 1000 to 2000 Å and more preferably about 1500 Å.

Next, bit line contact holes are opened in the dielectric insulating layer 28 over the drains 4. This can be accomplished with conventional photo masking and etching processes. A conductive layer is then formed over the dielectric insulating layer 28 and fills the bit line contact hole. The conductive layer is preferably formed of a polysilicon layer (24) and a tungsten silicide ($Wsi_x$) layer (26). The conductive line is then patterned to form a bit line 24 26. The polysilicon layer 24 preferably has a thickness in the range of between about 500 and 1000 Å and preferably has a doping concentration in the range of between about 1E20 and 1E21 atoms/cm³. The tungsten silicide layer 26 preferably has a thickness in the range of between about 1000 and 1500 Å.

Still referring to FIG. 1, a first insulation layer 30 is formed over the dielectric layer 28 and bit line 24 26. The first insulation layer 30 is preferably formed of a silicon oxide, such as an undoped silicon glass, formed by atmospheric TEOS process at a temperature in the range of between about 690° and 720° C. The first insulation layer 30 preferably has a thickness in the range of between about 2000 and 4000 Å and more preferably about 3000 Å. Preferably, to planarized the first insulation layer 30, a spin-on-glass (SOG) (not shown) layer having a thickness of about 2000 Å is formed over the first insulation layer 30. Next, an oxide etch is used to etch back the spin-on-glass layer and the first insulation layer 30 by about a total of 3000 Å to form a planar surface.

The remainder of this embodiment relates more specifically to those objects of the invention, which relate to the formation of the DRAM having a self-aligned node contact with a smaller size, less photo steps, increased capacitance, and also providing a more manufacturable process.

As shown in FIG. 1, a first conductive layer 32 is formed over the first insulation layer 30. The first conductive layer is preferably composed of doped or undoped polysilicon. A doped polysilicon conductive layer is preferably formed using a LPCVD reactor at a process temperature of between about 550° to 650° C. The polysilicon layer 32 can be doped N-type by ion implantation using, for example, arsenic ions and having an implant dose of between about 1E15 to 20E15 atoms/cm² and an ion energy of between about 20 to 80 Kev. Alternatively, the polysilicon layer can be doped in situ during the polysilicon deposition. Alternately, an undoped polysilicon layer 32 can be doped by a subsequent overlying layer 38 or 42 (see FIG. 4). The first conductive layer 32 preferably has a thickness in the range between about 500 to 1500 Å and more preferably a thickness of about 1000 Å. The first conductive layer preferably has an impurity concentration in the range of between about 1E20 and 1E21 atoms/cm³ and more preferably about 5E20 atoms/cm³. The first conductive layer 32 functions as an etch stop of a subsequent etch of layer 36. (See FIGS. 2 and 3.)

A first masking layer (i.e., second insulation layer) 34 is then formed over the first conductive layer 32. The first masking layer is patterned to form a first opening 36 over the source 8. An embodiment of the invention is where the first conductive layer 32 is patterned with the same process so that the first opening 36 extends through the first conductive layer 32 thereby exposing the first insulation layer 30. The first masking layer 34 has vertical sidewalls 39 that define the first openings. The first opening can have any shape, such as circular, rectangular, square; and preferably is rectangular. A rectangular shaped first opening 36 preferably has a length and width (L×W) in the range of between about 0.3×0.7 and 0.4×0.8 μm² and more preferably about 0.5×7 μm². The first masking layer 34 is preferably formed of undoped silicon glass having a thickness in the range of between about 4000 and 6000 Å and more preferably about 5000 Å.

Figure 2:
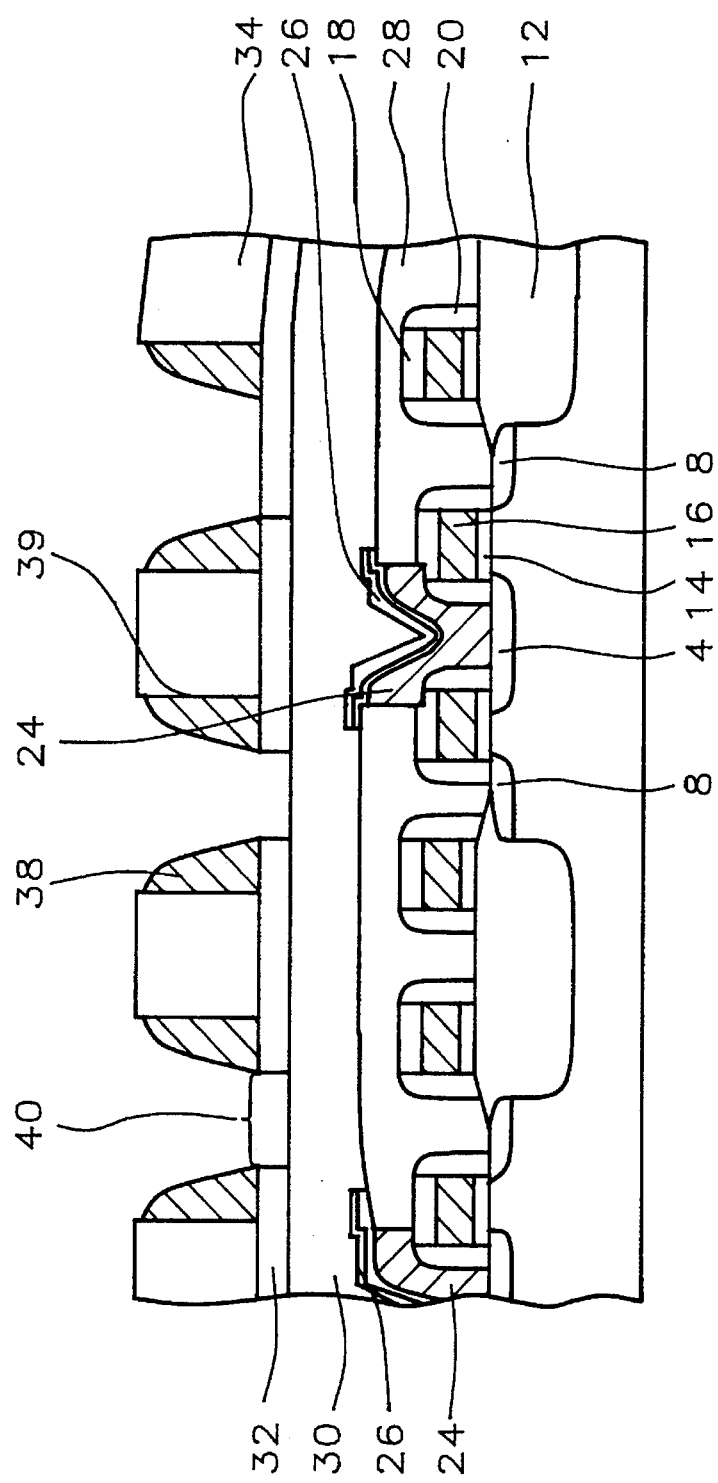

As shown in FIG. 2, first sidewall spacers 38 are formed on the sidewalls 39 of the first opening 36 in the first masking layer 34. The sidewall spacers 39 define a second opening 40 (i.e., the beginning of the node contact opening). The sidewall spacers can be formed by deposition a polysilicon layer over the surface and anisotropically etching back. The etch back can also etch and remove the underlying first conductive layer 32 in the opening between the spacers 38 over the source 8 if the first conductive layer 32 was not etched out earlier during the patterning of the first masking layer 32. (See above). The first sidewall spacers 38 have a thickness in the range of between about 500 and 1000 Å and are preferably formed of polysilicon. The spacers 38 are formed over the active area associated with the transistor. The distance between the inside walls of the spacers 38 is preferably in the range of between about 1000 and 3000 Å, and more preferably about 2000 Å. The spacers 38 preferably have a height in the range of between about 3000 and 5000 Å and more preferably about 4000 Å. The spacers 38 are preferably doped with an impurity concentration in the range of between about 1E20 and 1E21 atoms/cm³.

Figure 3:
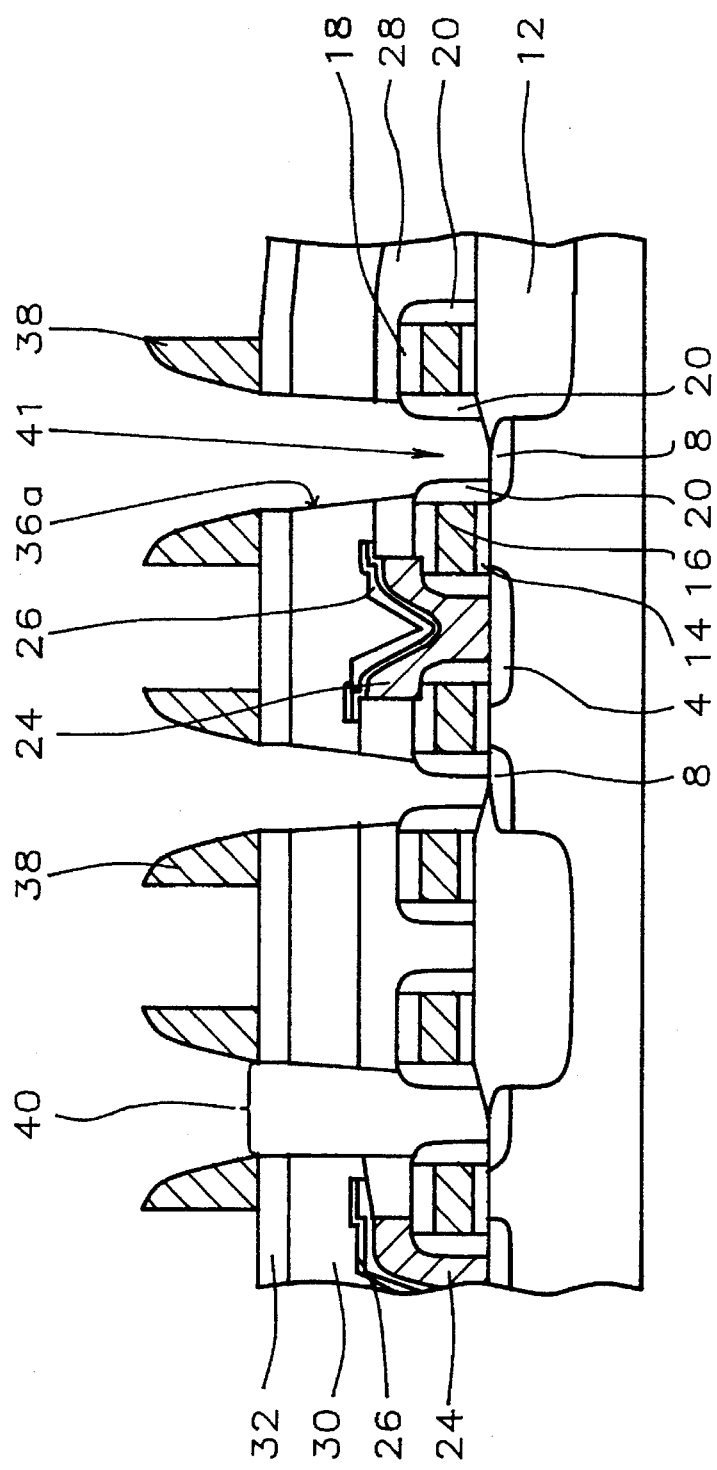

As shown in FIG. 3, the first insulation layer 28 30 and conformal dielectric layer 32 are anisotropically etched using the first masking layer/upper spacers 38 and the lower spacers (i.e., transfer gate spacers 20) as masks. The etch exposes the source 8. The first conductive layer 32 acts as an etch barrier. This etch step completes the formation of the node contact hole 41. The node contact opening 41 is defined by the first sidewall spacers 38; the transfer gate sidewall spaces 20, sidewalls of the first insulation layer 36A and the sidewalls of the first conductive layer 32. The etch is preferably an oxide etch using a RIE etch using $C_3F_8$+CO etchants in a timed mode. The anisotropic etch has a high selectivity to etch silicon oxide over silicon nitride and silicon.

Figure 4:
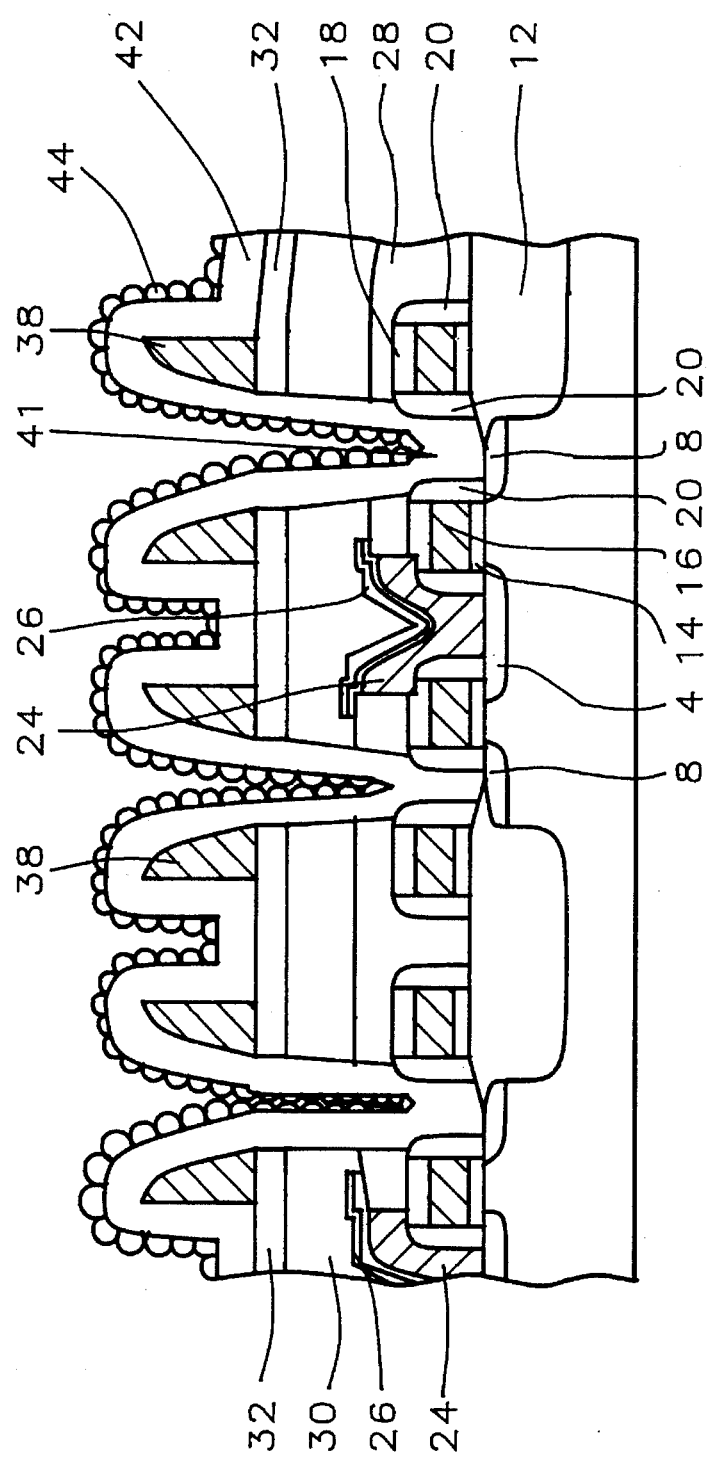
Figure 5:
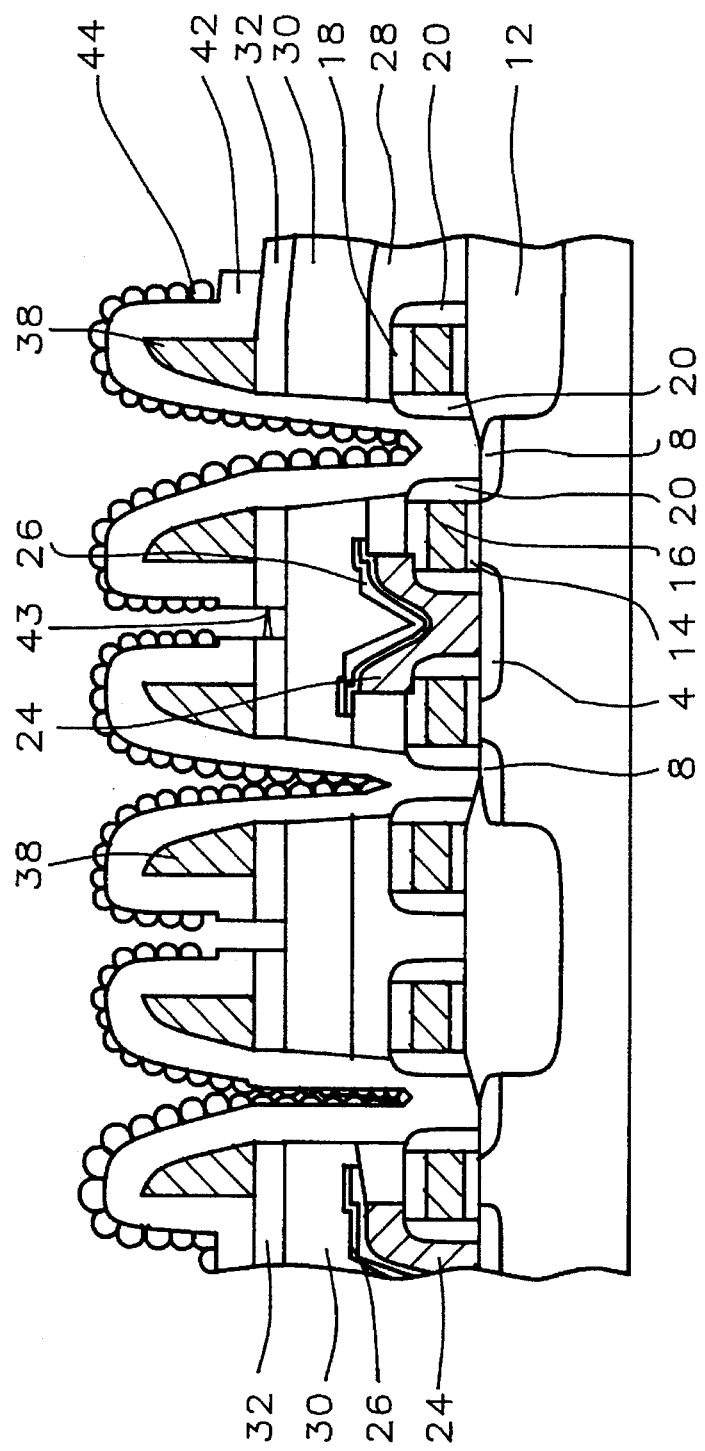

As shown in FIGS. 4 and 5, a third conductive layer 42, 44 is then formed over the first sidewall spacers 38 and fills the contact hole 41. The conductive layer 42, 44 contacts the source 08. The conductive layer is preferably formed of two layers 42, 44. The bottom layer 42 is preferably a polysilicon layer. The polysilicon layer 42 is preferably doped with an impurity concentration in the range of between about 1E20 and 1E21 atoms/cm³ and preferably has a thickness in the range of between about 400 and 1000 Å and more preferably about 500 Å. The doped polysilicon layer 42 can be formed by an in situ doping process. The upper layer 44 is preferably a hemispherical silicon grain (HSG) layer (or rugged polysilicon layer) which is used to increase the surface area and capacitance of the device. The rugged polysilicon layer 44 can have a thickness in the range of between about 500 and 1500 Å and more preferably about 1000 Å.

The rugged polysilicon layer 44 (e.g., hemispherical grain silicon) can be formed by any conventional low temperature deposition and/or anodic process. For example, polysilicon can be deposited from the decomposition of silane $SiH_4$ in a hot wall vertical LPCVD reactor, at a pressure of about 0.2 torr and a temperature of about 560° C. to produce hemispherical shaped grains (HSG) having a diameter of about 800 Å. Using a temperature of 565° C. leads to cylindrical grains. Caution must be used to carefully control the temperature in the reactor during deposition since deposition deposited films can become amorphous if the temperature falls to about 550° C.

As shown in FIG. 5, the polysilicon layer 42 44 is then anisotropically etched to form an opening 43 over the bit line 24 and between adjacent bottom storage electrodes. The opening 43 electrically isolates the storage electrodes from adjacent storage electrodes.

Figure 6:
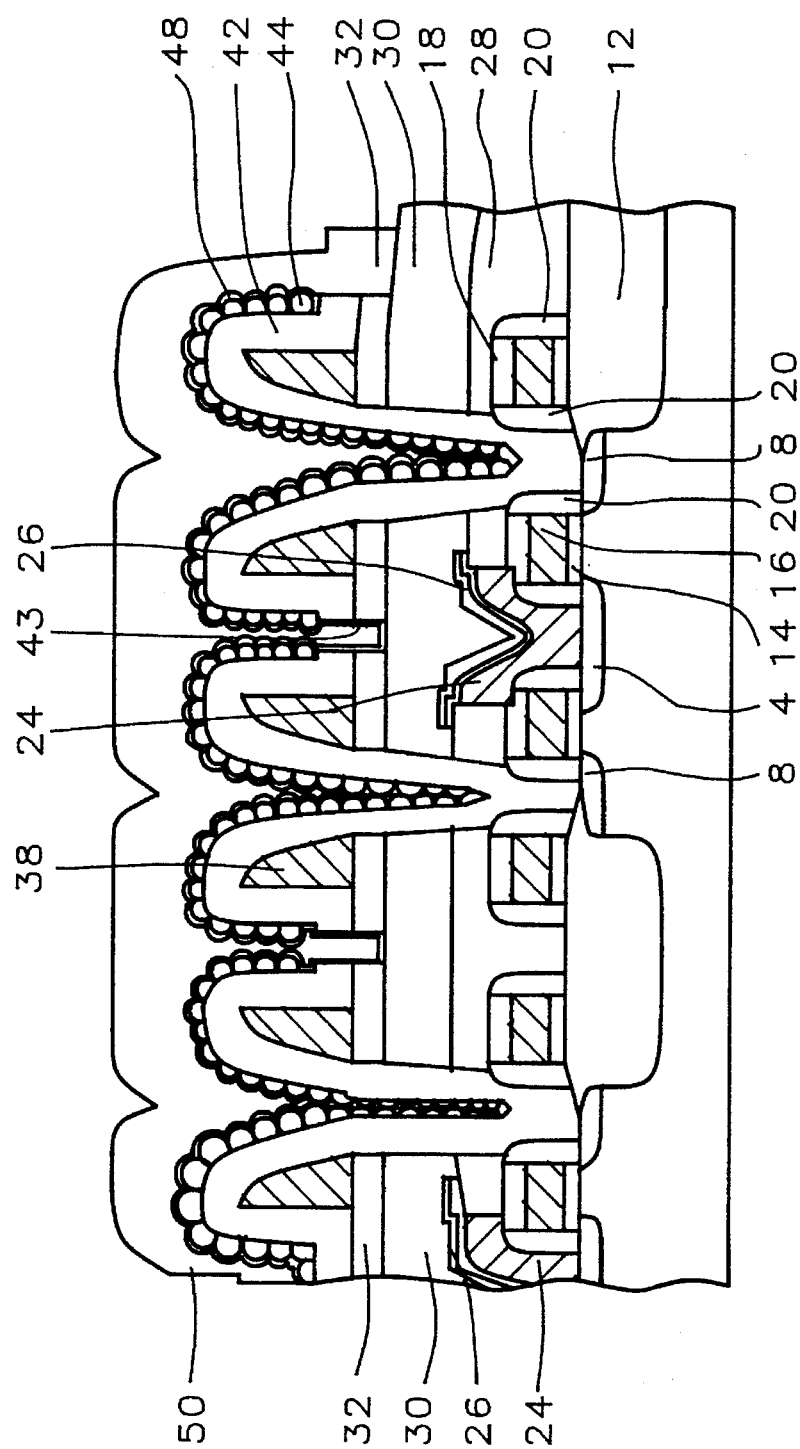

Next, a capacitor dielectric layer 48 is formed over the first electrode 42 44 as shown in FIG. 6. The material of the dielectric layer 48 can be any suitable material having a high dielectric constant and being continuous and pinhole free. The conformal dielectric layer 42 can be formed of silicon nitride, an oxide/nitride/oxide (ONO) film, tantalum pentoxide ($Ta_2O_5$), or silicon oxide material. Preferably, the conformal dielectric layer is formed of the three layer structure of silicon oxide/silicon nitride/silicon oxide (ONO). The conformal dielectric layer 48 preferably has a thickness in the range between about 40 and 60 Å and more preferably about 55 Å.

A top electrode 50 is then formed over the dielectric layer 48. This is accomplished by forming a third conductive layer over the substrate surface. The third conductive layer is masked and etched, using conventional photolithographic techniques, to form the top plate electrode 50 as shown in FIG. 6. The top electrode 50 can have a thickness in the range between about 500 and 2000 Å and more preferably about 1000 Å. The top plate electrode 50 is preferably formed a polycrystalline silicon doped with an impurity. The top plate electrode 50 preferably has an impurity concentration in the range of between about 1E20 and 1E21 atoms/cm$^3$ and more preferably about 5E20 atoms/cm$^3$.

Figure 7:
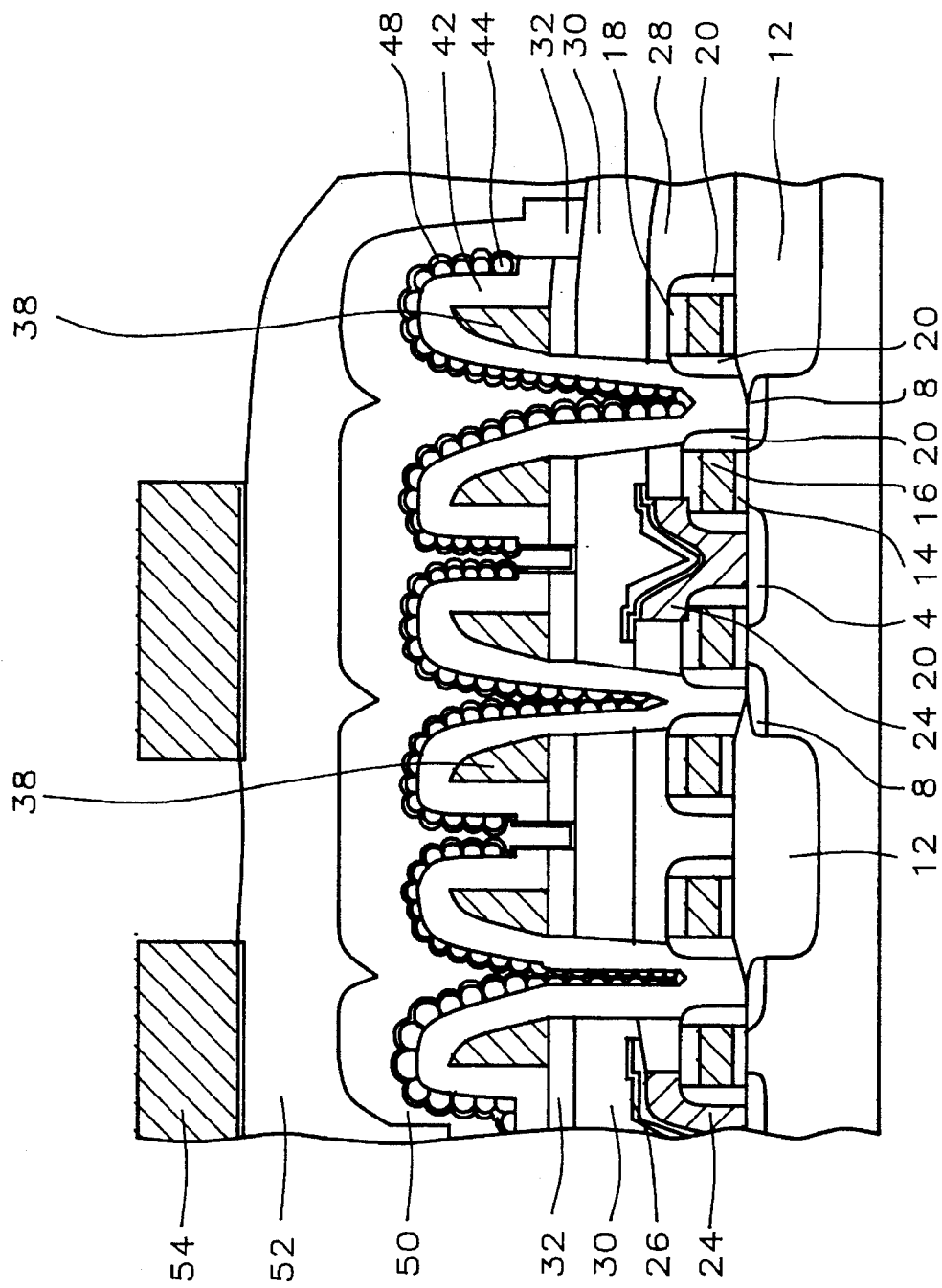

Now turning to FIG. 7, the device is completed by forming a second insulation layer over the top electrode 50 and the remaining substrate surface. The second insulation layer 52 is formed preferably of borophosphosilicate glass (BPSG) having a thickness in the range of between about 4500 and 6000 Å.

Next, a metal pattern 54 is formed over the second insulation layer 52 to form further connections in the device, such as a memory cell or logic device.

The invention provides a self aligning method to define a node contact using only one photoresist step which reduces costs and increases process tolerances. The method reduces process complexity by using only one photo operation to form the node contact opening. The invention increases process tolerances by making the node contact self-aligning by using the first and transfer gate spacers to align the node contact opening. Moreover, the novel fence shaped bottom electrode combined with the rugged polysilicon coating on the bottom electrode increase the capacitance of the capacitor.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a capacitor on a substrate having an active area, comprising the sequential processes of:

a) forming a first planar insulation layer over said substrate;

b) sequentially forming a first conductive layer and a second insulation layer over said first insulation layer;

c) forming a first opening in said second insulation layer centered over said active area and exposing said first conductive layer, said first opening defined by vertical sidewalls of said second insulation layer;

d) forming first sidewall spacers on the sidewalls of said second insulation layer, said first sidewall spacers forming a second opening;

e) anisotropically etching portions of said first conductive layer and said first insulation layer through said second opening and thereby exposing said active area, said anisotropic etch forming a node contact hole;

f) removing said second insulation layer exposing remaining portions of said first conductive layer;

g) forming a bottom storage electrode over the exposed portions of said first conductive layer and said first sidewall spacers, and filling said node contact hole;

h) depositing a capacitor dielectric layer over said bottom storage electrode; and forming a top plate electrode over said capacitor dielectric layer.

2. The method of claim 1 wherein said substrate further includes a field oxide region, a word line formed on said field oxide region, and a MOS transistor formed on said active area, said MOS transistor having a gate electrode, a source region, and a drain region formed in said active area, said word line and said gate electrode having silicon nitride sidewalls spacers; and wherein step (e) further includes anisotropically etching said first insulation layer using said silicon nitride sidewall spacers as a mask.

3. The method of claim 2 wherein said silicon nitride spacers have a thickness in a range of between about 400 and 1500 Å and a height in a range of between about 3000 and 5000 Å, and a distance between said silicon nitride spacers is in a range of between about 500 and 2000 Å.

4. The method of claim 1 wherein said first insulation layer is composed of two layers comprising a lower dielectric layer and an upper planarization layer, said dielectric layer formed of silicon oxide having a thickness in a range of between about 1000 and 2000 Å, and said planarization layer formed of silicon oxide having a thickness in a range of between about 2000 and 4000 Å.

5. The method of claim 1 wherein said first conductive layer is formed of a doped polysilicon layer having an impurity concentration in a range of between about 1E20 and 1E21 atoms/cm$^3$ and a thickness in a range of between about 500 and 1500 Å.

6. The method of claim 1 wherein said second insulation layer is formed of undoped silicon glass having a thickness in a range of between about 4000 and 6000 Å.

7. The method of claim 1 wherein said first sidewall spacers are formed of polysilicon material and have a thickness in a range of between about 500 and 1000 Å and a height in a range of between about 3000 and 5000 Å and a distance between the inside walls of said first sidewall spacers is in a range of between about 1000 and 3000 Å.

8. The method of claim 1 wherein said bottom storage electrode is formed by: (a) forming a doped polysilicon layer and a ragged polysilicon layer over the substrate surface, and (b) anisotropically etching said doped polysilicon layer, said rugged polysilicon layer, and said first conductive layer thereby forming an opening that exposes said first insulation layer, said doped polysilicon layer having a thickness in a range of between about 400 and 1000 Å; and said doped polysilicon layer having a doping concentration in a range of between about 1E20 and 1E21 atoms/cm$^3$ and said rugged polysilicon layer having a thickness in a range of between about 500 and 1500 Å.

9. The method of claim 1 wherein said capacitor dielectric layer is formed of oxide/nitride/oxide (ONO) and has a thickness in a range of between about 40 and 60 Å.

10. The method of claim 1 wherein said top plate electrode is formed of doped polysilicon having a impurity concentration in a range of between about 1E20 and 1E21 atoms/cm$^3$ and a thickness in a range of between about 500 and 2000 Å.

11. The method of claim 1 wherein step (d) comprises depositing a polysilicon layer over said second insulation layer and anisotropically etching said polysilicon layer and said second insulation layer to expose top surfaces of said second insulation layer and said first insulation layer thereby forming first sidewall spacers on said vertical sidewalls of said second insulation layer.

12. A method of fabricating a capacitor of a semiconductor memory device on a substrate, said substrate having a field oxide region with a word line formed thereon, said substrate having a MOS transistor formed thereon, said transistor having a gate, a source region and a drain region, said word line and said gate having silicon nitride sidewall spacers, and the method comprising the steps of:
 a) forming a first planar insulation layer over said substrate, said first planar insulation layer formed of silicon oxide;
 b) sequentially forming a first conductive layer and a second insulation layer over the first insulation layer, said first conductive layer formed of polysilicon and said second insulation layer formed of silicon oxide;
 c) forming a first opening in said second insulation layer over said source region and exposing said first conductive layer, said first opening defined by vertical sidewalls of said second insulating layer;
 d) depositing a polysilicon layer over said second insulation layer;
 e) anisotropically etching said polysilicon layer and said first conductive layer to expose said second insulation layer thereby forming first sidewall spacers on said vertical sidewalls of said second insulation layer, said first sidewall spacers forming a second opening;
 f) anisotropically etching said first conductive layer and said first insulation layer through said second opening, and using said silicon nitride sidewall spacers as a mask thereby exposing said source region, said anisotropic etch forming a node contact opening;
 g) removing said second insulating layer exposing portions said first conductive layer;
 h) forming a bottom storage electrode over the exposed portions of said first conductive layer and said first sidewall spacers, and in said node contact opening;
 i) depositing a capacitor dielectric layer covering said bottom storage electrode;
 j) forming a top plate electrode over said capacitor dielectric layer; and
forming a top insulation layer and a metal layer over a substrate surface.

13. The method of claim 12 wherein said first insulation layer is composed of two layers comprising a dielectric layer and a planarization layer, said dielectric layer formed of silicon oxide having a thickness in a range of between about 1000 and 2000 Å and said planarization layer formed of silicon oxide having a thickness in a range of between about 2000 and 4000 Å.

14. The method of claim 12 wherein said first conductive layer is formed of a doped polysilicon layer having an impurity concentration in a range of between about 1E20 and 1E21 atoms/cm$^3$ and a thickness in a range of between about 500 and 1500 Å.

15. The method of claim 12 wherein first sidewall spacers are formed of polysilicon material and have a thickness in a range of between about 500 and 1000 Å and a height in a range of between about 3000 and 5000 Å and a distance between the inside walls of said first sidewall spacers in a range of between about 1000 and 3000 Å.

16. The method of claim 12 wherein said bottom storage electrode is formed by: (a) forming a doped polysilicon layer and a rugged polysilicon layer over the substrate surface, and (b) anisotropically etching said doped polysilicon layer, said rugged polysilicon layer, and said first conductive layer thereby forming an opening that exposes the first insulation layer, said doped polysilicon layer having a thickness in a range of between about 400 and 1000 Å, and said rugged polysilicon layer having a doping concentration in a range of between about 1E20 and 1E21 atoms/cm$^3$ and having a thickness in a range of between about 500 and 1500 Å.

17. The method of claim 12 wherein said top plate electrode is formed of a doped polysilicon having an impurity doping concentration in a range of between about 1E20 and 1E21 atoms/cm$^3$ and a thickness in a range of between about 500 and 2000 Å.

18. A method of fabricating DRAM having a capacitor on a semiconductor substrate, comprising the steps of:
 a) providing a MOS (metal oxide semiconductor) transistor having a gate centered between spaced source and drain region, and providing a word line over a field oxide region, said gate and said word line having silicon nitride sidewall spacers,
 b) forming a first insulation layer composed of silicon oxide over said transistor, said word line, and said field oxide region;
 c) sequentially forming a first conductive layer and a second insulation layer over said first insulation layer, said first conductive layer composed of polysilicon and said second insulation layer composed of silicon oxide;
 d) forming a first opening in said second insulation layer centered over said source region and exposing said first conductive layer, said first opening defined by vertical sidewalls of said second insulation layer;
 e) depositing a polysilicon layer over the said second insulation layer;
 f) anisotropically etching said polysilicon layer and said first conductive layer to expose said second insulation layer thereby forming first sidewall spacers on said vertical sidewalls of said second insulation layer, said first sidewall spacers forming a second opening;
 g) anisotropically etching portions of said first conductive layer and said first insulation layer through said second opening and said silicon nitride spacers thereby exposing said source region, said anisotropic etch forming a node contact opening;
 h) removing said second insulation layer exposing remaining portions of said first conductive layer;
 i) forming a bottom storage electrode over the exposed portions of said first conductive layer and said first sidewall spacers, and filling said node contact opening, said bottom storage electrode composed of a doped polysilicon layer and a hemispherical grain layer;
 j) depositing a capacitor dielectric layer over said bottom storage electrode;
 k) forming a top plate electrode over said capacitor dielectric layer; and
 l) forming a top insulation layer and a metal layer over said top plate electrode and said first insulation layer.

19. The method of claim 18 wherein said first insulation layer is composed of two layers comprising a dielectric layer and a planarization layer over said dielectric layer; said dielectric layer formed of silicon oxide having a thickness in a range of between about 1000 and 2000 Å and said planarization layer formed of silicon oxide having a thickness in a range of between about 2000 and 4000 Å.

20. The method of claim 18 wherein said first conductive layer is formed of a doped polysilicon layer having an impurity concentration in a range of between about 1E20 and 1E21 atoms/cm$^3$ and a thickness in a range of between about 500 and 1500 Å.

21. The method of claim 18 wherein said second insulation layer is formed of undoped silicon oxide having a thickness in a range of between about 4000 and 6000 Å.

22. The method of claim 18 wherein said first sidewall spacers have a thickness in a range of between about 500 and 1000 Å and are formed of polysilicon.

23. The method of claim 18 wherein first sidewall spacers are formed of polysilicon material and have a thickness in a range of between about 500 and 1000 Å and a height in a range of between about 3000 and 5000 Å and a distance between the inside walls of said first sidewall spacers in a range of between about 1000 and 3000 Å.

24. The method of claim 18 wherein said bottom storage electrode is formed by: (a) forming a doped polysilicon layer and a rugged polysilicon layer over the substrate surface, and (b) patterning said doped polysilicon layer, said rugged polysilicon layer, and said first conductive layer into individual storage electrodes.

25. The method of claim 18 wherein said bottom storage electrode is formed by: (a) forming a doped polysilicon layer and a rugged polysilicon layer over the substrate surface, and (b) patterning said doped polysilicon layer, said rugged polysilicon layer, and said first conductive layer thereby forming an opening that exposes the first insulation layer, said doped polysilicon layer having a thickness in a range of between about 400 and 1000 Å, said doped polysilicon layer and said rugged polysilicon layer having a doping concentration in a range of between about 1E20 and 1E21 atoms/cm$^3$.

\* \* \* \* \*